(12) United States Patent
Lee et al.

(10) Patent No.: US 10,566,422 B2
(45) Date of Patent: Feb. 18, 2020

(54) POWER SEMICONDUCTOR DEVICE AND METHOD FOR MANUFACTURING THE SAME

(71) Applicant: Magnachip Semiconductor, Ltd., Cheongju-si (KR)

(72) Inventors: Tae Hoon Lee, Sejong-si (KR); Jun Hee Cho, Cheongju-si (KR); Jin Seong Chung, Cheongju-si (KR)

(73) Assignee: MagnaChip Semiconductor, Ltd., Cheongju-su (KR)

( * ) Notice: Subject to any disclaimer, the term of this patent is extended or adjusted under 35 U.S.C. 154(b) by 0 days.

(21) Appl. No.: 16/054,472

(22) Filed: Aug. 3, 2018

(65) Prior Publication Data
US 2019/0288066 A1 Sep. 19, 2019

(30) Foreign Application Priority Data
Mar. 16, 2018 (KR) .................. 10-2018-0031056

(51) Int. Cl.
| | | |
|---|---|---|
| H01L 29/78 | (2006.01) | |
| H01L 29/08 | (2006.01) | |
| H01L 29/66 | (2006.01) | |
| H01L 29/417 | (2006.01) | |
| H01L 23/522 | (2006.01) | |
| H01L 29/10 | (2006.01) | |

(Continued)

(52) U.S. Cl.
CPC .... *H01L 29/0847* (2013.01); *H01L 21/26586* (2013.01); *H01L 23/5225* (2013.01); *H01L 29/1045* (2013.01); *H01L 29/1083* (2013.01); *H01L 29/402* (2013.01); *H01L 29/4175* (2013.01); *H01L 29/66659* (2013.01); *H01L 29/7835* (2013.01)

(58) Field of Classification Search
CPC ............. H01L 29/0847; H01L 29/1045; H01L 29/1083; H01L 29/402; H01L 29/4175; H01L 29/66659; H01L 29/7835; H01L 21/26586; H01L 23/5225
USPC .......................................... 257/336
See application file for complete search history.

(56) References Cited

U.S. PATENT DOCUMENTS 7,138,690 B2   11/2006   Xie et al.
8,664,718 B2   3/2014    Cheng et al.
(Continued)

FOREIGN PATENT DOCUMENTS

KR    10-2017-0041477 A    4/2017

OTHER PUBLICATIONS

Korean Office Action dated May 19, 2019 in counterpart Korean Patent Application No. 10-2018-0031056 (11 pages, in Korean with English translation).

*Primary Examiner* — Tu-Tu V Ho
(74) *Attorney, Agent, or Firm* — NSIP Law

(57) ABSTRACT

A power semiconductor device includes a drain region and a source region disposed on a substrate, a gate insulating layer and a gate electrode disposed on the substrate and disposed between the drain region and the source region, a protection layer in contact with a top surface of the substrate and a top surface of the gate electrode, a source contact plug connected to the source region, a drain contact plug connected to the drain region, and a field plate plug in contact with the protection layer, wherein a width of the field plate plug is greater than a width of the source contact plug or a width of the drain contact plug.

20 Claims, 13 Drawing Sheets

(51) Int. Cl.
*H01L 21/265* (2006.01)
*H01L 29/40* (2006.01)

(56) References Cited

U.S. PATENT DOCUMENTS

2013/0277741 A1    10/2013  Guowei et al.
2017/0352731 A1*   12/2017  Kuo .................... H01L 29/401

* cited by examiner

POWER SEMICONDUCTOR DEVICE AND METHOD FOR MANUFACTURING THE SAME

CROSS-REFERENCE TO RELATED APPLICATIONS

This application claims the benefit under 35 USC 119(a) of Korean Patent Application No. 10-2018-0031056 filed on Mar. 16, 2018, the entire disclosure of which is incorporated herein by reference for all purposes.

BACKGROUND

1. Field

The following description relates to a power semiconductor device having a field plate plug. The following description also relates to a method for manufacturing such a power semiconductor device.

2. Description of Related Art

Switching devices with a high switching frequency and a low power loss have been widely used in power conversion and power control circuits. There are various types of double-diffused metal-oxide semiconductor (DMOS) transistors commonly used as such switching devices. For example, there are a vertical double-diffused metal oxide semiconductor (VDMOS), which is a vertical type of DMOS, and a lateral double-diffused metal oxide semiconductor (LDMOS) which is a lateral type of DMOS.

The LDMOS has been widely used as a switching device for control, logic, and power applications. The LDMOS may have a high breakdown voltage (BV) to be able to withstand a high voltage, and a low on-resistance to be able to minimize a conduction loss at the same time. Therefore, researches into a reduced surface field (RESURF) structure that reduces a peak electric field in a drain region in order to be able to have both the high breakdown voltage and the low on-resistance properties of a MOSFET have been conducted.

However, the existing RESURF technology has issues, in that a channel length formed between a gate electrode and a source electrode becomes long, and a separate device isolation layer, for example, an offset trench, such as an offset shallow trench isolation (STI) structure is additionally formed between the gate electrode and a drain electrode for the high breakdown voltage to make a process complicated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes a drain region and a source region disposed on a substrate, a gate insulating layer and a gate electrode disposed on the substrate and disposed between the drain region and the source region, a protection layer in contact with a top surface of the substrate and a top surface of the gate electrode, a source contact plug connected to the source region, a drain contact plug connected to the drain region, and a field plate plug in contact with the protection layer, wherein a width of the field plate plug is greater than a width of the source contact plug or a width of the drain contact plug.

A portion of the field plate plug may vertically overlap with the gate electrode.

The protection layer may include a first region disposed on the gate electrode, a second region disposed on the substrate, and a third region connecting the first region with the second region, wherein the field plate plug vertically overlaps with the second region.

The field plate plug may have a first length on the first region, the field plate plug may be a second length on the second region, and the second length may be greater than the first length.

The width of the field plate plug may be greater than the first length.

The power semiconductor device may further include an interlayer insulating layer disposed on the gate electrode and the protection layer, wherein the field plate plug penetrates through the interlayer insulating layer.

The power semiconductor device may further include a conductive line connecting the source contact plug to the field plate plug, wherein the field plate plug is in direct contact with the conductive line.

The power semiconductor device may further include a first conductivity type buried layer disposed on the substrate, and a second conductivity type buried layer disposed on the first conductivity type buried layer.

The power semiconductor device may further include a first conductivity type drift region and a second conductivity type body region disposed on the substrate.

The gate insulating layer may be disposed between the gate electrode and the first conductivity type drift region, and the gate insulating layer may be disposed between the gate electrode and the second conductivity type body region.

The drain region may be a first conductivity type drain region and may be disposed in the first conductivity type drift region.

The power semiconductor device may further include a silicide layer disposed on a top surface of the drain region.

When viewed as a plane, the field plate plug may be provided as having a single plate shape provided on the protection layer.

A portion of the protection layer may be in contact with the drain region.

The power semiconductor device may further include a etch stop layer disposed between the field plate plug and the protection layer.

The power semiconductor device may further include spacers provided at sidewalls of the gate electrode, wherein the field plate plug vertically overlaps with the spacers.

In another general aspect, a method for manufacturing a power semiconductor device includes providing a substrate, forming a gate insulating layer and a gate electrode on the substrate, forming a drain region and a source region on the substrate, forming a protection layer on the gate electrode, forming an interlayer insulating layer disposed on the gate electrode and the protection layer, forming a source contact hole, a drain contact hole, and a field plate hole, which expose the source region, the drain region, and the protection layer, respectively, by etching the interlayer insulating layer, and forming a source contact plug connected to the source region, a drain contact plug connected to the drain region, and a field plate plug contacting the protection layer, respectively, by filling the source contact hole, the drain contact hole, and the field plate hole, respectively with a conductive material, wherein a width of the field plate plug is greater than a width of the source contact plug or a width of the drain contact plug.

The providing of the substrate may include forming a first conductivity type buried layer on the substrate, forming a second conductivity type buried layer on the first conductivity type buried layer, and forming a first conductivity type drift region and a second conductivity type body region on the second conductivity type buried layer.

The method may further include forming a conductive line connecting the source contact plug to the field plate plug.

The method may further include forming a silicide layer on each of a top surface of the gate electrode, a top surface of the source region, and a top surface of the drain region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
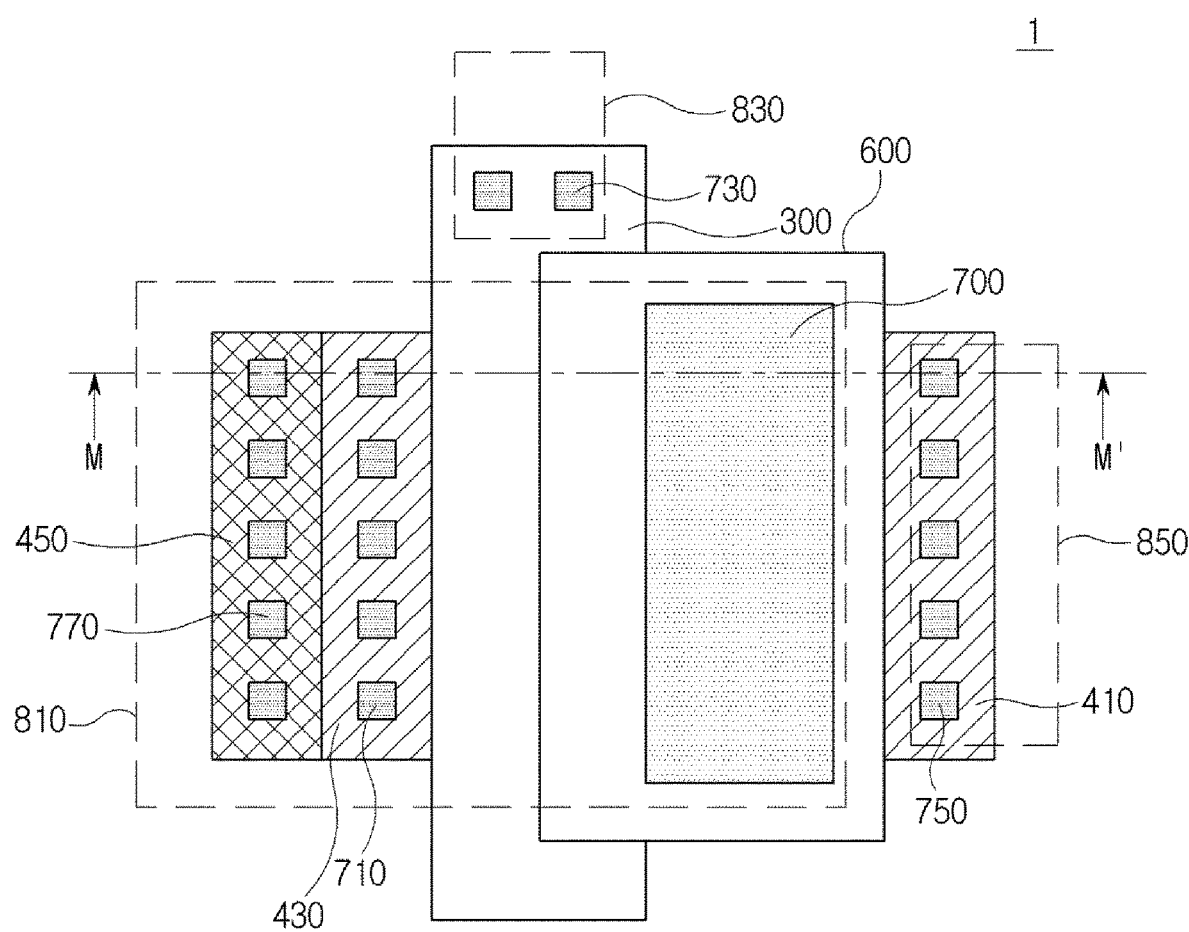
FIG. 1 is a plan view illustrating a power semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various advantages and features of the present examples will become apparent from the following detailed description of examples with reference to the accompanying drawings. However, the present examples are not limited to the embodiments disclosed herein but will be implemented in various forms. The embodiments have made disclosure of the present examples complete and are provided so that those skilled in the art can easily understand the scope of the present examples. Therefore, the present examples will be defined by the scope of the appended claims. Like reference numerals throughout the description denote like elements.

Further, the examples described in the specification will be described with reference to cross-sectional views and/or plan views that are ideal exemplification figures of the present examples. In drawings, the thickness of layers and regions is exaggerated for efficient description of technical contents. Therefore, examples of forms may be changed by manufacturing technologies and/or tolerances. Therefore, the embodiments of the present examples are not limited to shown specific forms but may include the change in forms generated according to the manufacturing processes. For example, an etching region vertically shown may be rounded or may have a predetermined curvature. Therefore, the illustrated regions in the drawings have schematic attributes, and the shapes of the illustrated regions in the drawings are for illustrating specific shapes of region of device and are not for limiting the scope of the present examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

An object of the examples is to provide a power semiconductor device capable of increasing a breakdown voltage with respect to that of alternatives.

Another object of the examples is to provide a power semiconductor device capable of relaxing a high electric field formed in a drain region by using a field plate plug without using a separate device isolation layer.

Still another object of the examples is to provide a power semiconductor device having a wiring structure capable of removing a parasitic capacitance component generated between a field plate plug and a drain region.

Other objects and advantages of the examples may be understood by the following description, and may become apparent with reference to the examples. Also, it would be known to those skilled in the art to which the examples pertain that the objects and advantages of the examples may be realized, at least, by the means as claimed and appropriate combinations thereof.

Figure 2:
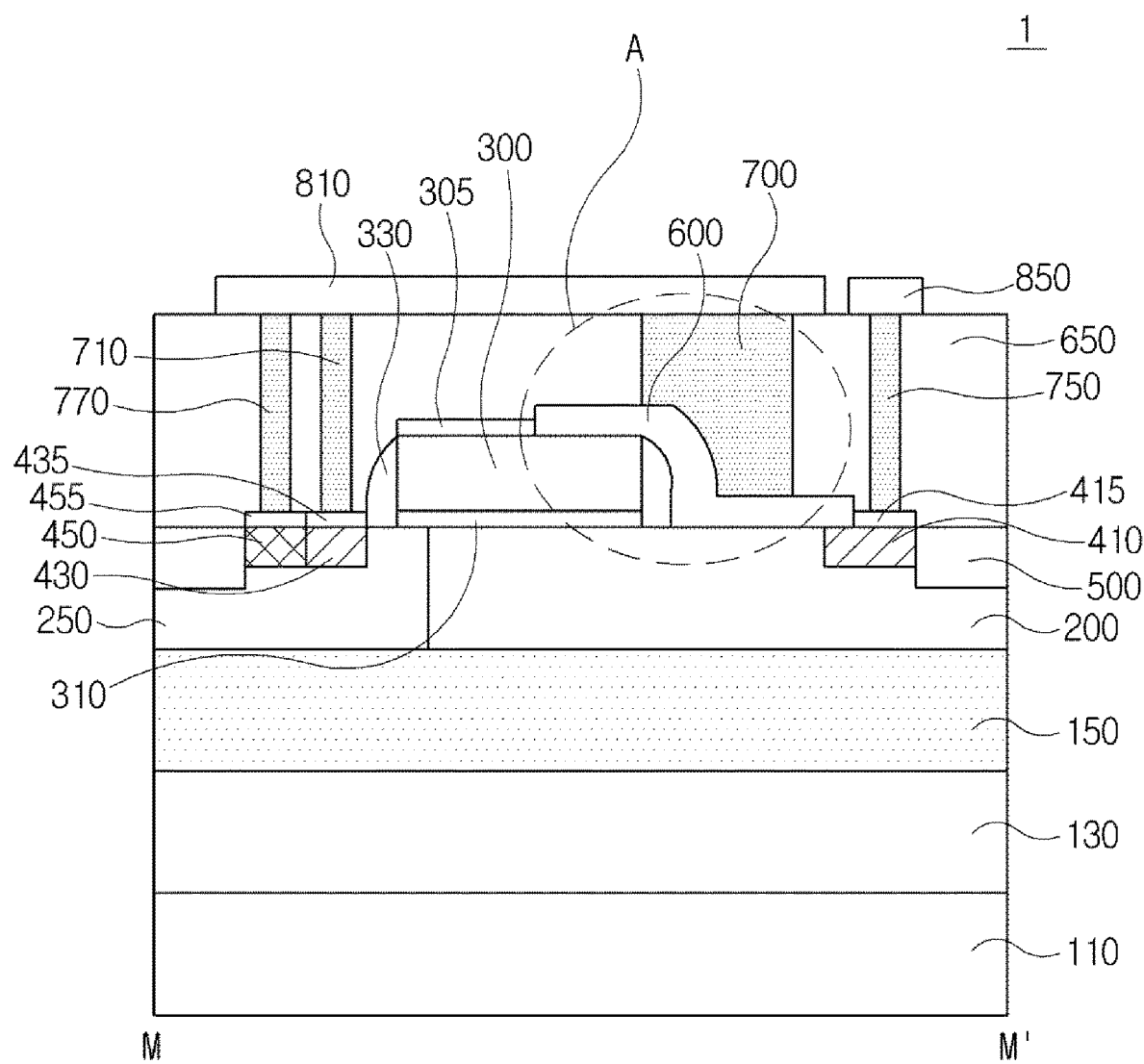
FIG. 2 is a cross-sectional view taken along line M-M' of the example of FIG. 1.

FIG. 1 is a plan view illustrating a power semiconductor device according to an example. FIG. 2 is a cross-sectional view taken along line M-M' of the example of FIG. 1.

Referring to the example of FIGS. 1 and 2, a power semiconductor device 1 may include a substrate 110, a first conductivity type buried layer 130, a second conductivity type buried layer 150, a first conductivity type drift region 200, a second conductivity type body region 250, a gate electrode 300, a first conductivity type drain region 410, a first conductivity type source region 430, a protection layer 600, where the protection layer 600 may be a silicide protection layer 600, an interlayer insulating layer 650, a field plate plug 700, and conductive lines 810, 830, and 850.

The substrate 110 may be an epi-layer or a silicon substrate. For example, the substrate 110 may be a P-type silicon substrate. However, it will be recognized that the substrate 110 may also be formed using other appropriate materials, in other examples. In the examples of FIG. 1 and FIG. 2, the first conductivity type buried layer 130 and the second conductivity type buried layer 150 may be sequentially disposed on the substrate 110. For example, the first conductivity type buried layer 130 may be a layer doped with a high-concentration N-type impurity, and the second conductivity type buried layer 150 may be a layer doped with a high-concentration P-type impurity. Accordingly, the first conductivity type buried layer 130 and the second conductivity type buried layer 150 may be used as part of a fully isolated MOS device in a high voltage device. Because the first conductivity type buried layer 130 and the second conductivity type buried layer 150 are disposed on the substrate 110, noise occurring due to switching of a high voltage device may be reduced, such that a leakage current may also be reduced. In addition, because the second conductivity type buried layer 150 doped with P-type impurities is disposed beneath the first conductivity type drift region 200, as is described later in greater detail, the concentration of the first conductivity type drift region 200 may be increased, such that a depletion region is deeply formed up to the second conductivity type buried layer 150 in a reverse bias state, thereby greatly increasing a depletion area of the overall device. Because the area of the depletion region is increased, the breakdown voltage may therefore be kept high as well.

In the examples of FIG. 1 and FIG. 2, the first conductivity type drift region 200 and the second conductivity type body region 250 may be disposed on the second conductivity type buried layer 150. For example, the first conductivity type drift region 200 may be a region doped with N-type impurities, and the second conductivity type body region 250 may be a region doped with P-type impurities. The first conductivity type drift region 200 has a configuration for improving the breakdown voltage of the power semiconductor device 1. According to the principle that the breakdown voltage increases when the doping concentration of the impurity is low in a PN junction semiconductor device, the first conductivity type drift region 200 doped at the low concentration may improve the performance of the power semiconductor device 1 with respect to withstanding voltage. Likewise, the second conductivity type body region 250 may be the channel region doped with the low-concentration P-type impurity. Such a second conductivity type body region 250 may be the region in which the channel between the source and the drain is formed.

According to the example of FIG. 2, the first conductivity type drift region 200 and the second conductivity type body region 250 may each be provided with a device isolation layer 500. The device isolation layer 500 may be formed in a trench shape to isolate electrical activity between adjacent devices. For example, the device isolation layer 500 may be an oxide layer. However, other types of layers are possible in other examples.

The gate electrode 300 may be disposed on the first conductivity type drift region 200 and the second conductivity type body region 250. In an example, the gate electrode 300 may be made of polysilicon (poly-Si). A gate insulating layer 310 may be disposed between the gate electrode 300 and the first conductivity type drift region 200 and the second conductivity type body region 250. In such examples, the gate insulating layer 310 may be made of materials such as silicon oxide ($SiO_2$), silicon nitride (SiN), or silicon oxynitride (SiON). A silicide layer 305 may be provided on a portion of the gate electrode 300. The silicide layer 305 may be used to lower a resistance between gate contact plugs 730 and the gate electrode 300, which will be described further, later. Therefore, in such an example, the silicide layer 305 may be formed around an area at which the gate contact plugs 730 are formed. Furthermore, in such an example, spacers 330 are formed at sidewalls of the gate electrode 300. The spacers 330 may be formed at sidewalls of the gate electrode and may be made of materials such as SiN/SiO$_2$, though other materials with similar properties may be used in other examples.

In the examples of FIGS. 1 and 2, the first conductivity type drain region 410 may be provided in the first conductivity type drift region 200. For example, the first conductivity type drain region 410 may be a region doped with N-type impurities. In such an example, a separate device isolation layer is not present in the first conductivity type drift region 200 disposed between the first conductivity type drain region 410 and the gate electrode 300. Also in such an example, a silicide layer 415 may be provided on the first conductivity type drain region 410. The silicide layer 415 may be used to lower a resistance between drain contact plugs 750 and the first conductivity type drain region 410, as is described in further detail, later.

In the examples of FIGS. 1 and 2, the first conductivity type source region 430 is provided in the second conductivity type body region 250. For example, the first conductivity type source region 430 may be a region doped with N-type impurities. If a voltage is applied to the first conductivity type drain region 410 and to the gate electrode 300, a channel may be formed as a result in the second conductivity type body region 250 disposed between the first conductivity type source region 430 and the gate electrode 300. In such an example, a silicide layer 435 may be provided on the first conductivity type source region 430. The silicide layer 435 may be used to lower the resistance between a source contact plug 710 and the first conductivity type source region 430, which is described in further detail later. In such an example, a second conductivity type pickup region 450 disposed adjacent to the first conductivity type source region 430 is provided in the second conductivity type body region 250. For example, the second conductivity type pickup region 450 may be a region doped with P-type impurities. Also, a silicide layer 455 may be provided on the second conductivity type pickup region 450. Such a silicide layer 455 may be used to lower a resistance between the body contact plugs 770 and the second conductivity type pickup region 450, which is described in further detail later.

In the examples of FIGS. 1 and 2, the protection layer 600 may be disposed on the first conductivity type drift region 200 and the gate electrode 300. For example, the protection layer 600 may be formed to extend from the first conductivity type drift region 200 onto the gate electrode 300. The protection layer 600 may cover a portion of a top surface of the gate electrode 300, and may not overlap with the silicide layer 305 disposed on the gate electrode 300. Thus, the protection layer 600 is to be regarded as a silicide blocking layer, because the protection layer 600 prevents the silicon atoms from formation of the silicide layer 305, 415 on a surface of the substrate 110 or the gate electrode 300. In addition, the protection layer 600 may cover a portion of a top surface of the first conductivity type drain region 410 and may not overlap with the silicide layer 415 disposed on the first conductivity type drain region 410. The protection layer 600 may be made of silicon oxide (SiO$_2$), silicon nitride (SiN), silicon oxynitride (SiON), or a low-k dielectric material having a low dielectric constant. However, these are only examples, and the protection layer 600 may be formed of other materials having similar properties in other examples. Also, a thickness of the protection layer 600 may be adjusted appropriately based on the breakdown voltage required for the power semiconductor device 1.

In the examples of FIGS. 1 and 2, the interlayer insulating layer 650 is disposed on the gate electrode 300. For example, the interlayer insulating layer 650 may be provided to cover the gate electrode 300, the first conductivity type drift region 200, the second conductivity type body region 250, and the blocking insulating layer 600. The interlayer insulating layer 650 may be made of silicon oxide (SiO$_2$) or materials such as undoped silicate glass (USG), tetraethyl orthosilicate (TEOS), borophosphosilicate glass (BPSG), and phosphosilicate glass (PSG). However, these are only examples, and the interlayer insulating layer may be formed of other materials having similar properties in other examples.

The field plate plug 700 may be provided to penetrate through the interlayer insulating layer 650. For example, the field plate plug 700 may be disposed on the protection layer 600 and may contact the protection layer 600. The field plate plug 700 may also be disposed to vertically overlap with the spacer 330. Additionally, the field plate plug 700 may be disposed not to vertically overlap with the gate electrode 300. Accordingly, when viewed as a plane, the field plate plug 700 may be provided in a plate shape on the protection layer 600. However, the field plate plug 700 may vertically overlap with the second conductivity type buried layer 150. For example, the field plate plug 700 may be made of conductive materials such as polysilicon or metals of tungsten (W), aluminum (Al), copper (Cu) or other conductive metals. However, these are only example materials, and other materials having similar conductive properties may be used in other examples.

The high electric field formed in the drain region is relaxed by the presence of the field plate plug 700. That is, the electric field may be uniformly distributed without being concentrated on one place due to such a relaxation phenomenon. Accordingly, it is possible to increase the breakdown voltage of the power semiconductor device 1 by providing the field plate plug 700 in this manner. To further this goal, a ground voltage may be applied to the field plate plug 700.

In the examples of FIGS. 1 and 2, the plurality of contact plugs 710, 730, 750, and 770 may be provided so as to penetrate through the interlayer insulating layer 650. For example, the plurality of contact plugs 710, 730, 750 and 770 may be made of conductive materials. In such an example, the plurality of contact plugs 710, 730, 750 and 770 include the source contact plug 710 connected to the first conductivity type source region 430, the gate contact plug 730 connected to the gate electrode 300, the drain contact plug 750 connected to the first conductivity type drain region 410, and the body contact plug 770 connected to the second conductivity type pickup region 450. Furthermore, the source contact plug 710, the gate contact plug 730, the drain contact plug 750, and the body contact plug 770 may each be provided in plural. Also, in such an example, the source contact plug 710 may contact the silicide layer 435, the gate contact plug 730 contacts the silicide layer 305, the drain contact plug 750 may contact the silicide layer 415, and the body contact plug 770 may contact the silicide layer 455. In this example, the source contact plug 710 and the body contact plug 770 may be connected to a first conductive line 810, the gate contact plug 730 may be connected to a second conductive line 830, and the drain contact plug 750 may be connected to a third conductive line 850. At this time, because the field plate plug 700 contacts the first conductive line 810 to be electrically connected to the first conductive line 810, the field plate plug 700 may be electrically connected to the source contact plug 710 and the first conductivity type source region 430. The field plate plug 700 and the first conductivity type source region 430 are electrically connected to each other, such that it is possible to remove the parasitic capacitance component occurring between the field plate plug 700 and the first conductivity type drain region 410.

Here, the source contact plug 710, the gate contact plug 730, the drain contact plug 750, and the body contact plug 770 may be formed simultaneously. That is, in the process of forming the contact plug, the source contact plug 710, the gate contact plug 730, the drain contact plug 750, and the body contact plug 770 are formed as well, at the same time.

For example, the source contact plug 710, the gate contact plug 730, the drain contact plug 750, and the body contact plug 770 may each be provided in plural in a single power semiconductor device 1, but a single field plate plug 700 may be provided. When viewed from a plane view, an area of the field plate plug 700 may be larger than a sum of areas of the source contact plugs 710 that are provided in plural. In addition, the area of the field plate plug 700 may be larger than the sum of the areas of the gate contact plugs 730 that are provided in plural. Alternatively, the area of the field plate plug 700 may be larger than a sum of areas of the drain contact plugs 750 that are provided in plural. Alternatively, the area of the field plate plug 700 may be larger than a sum of areas of the body contact plugs 770 that are provided in plural.

When viewed in a channel length direction, a width of the field plate plug 700 is larger than that of the source contact plug 710 and the drain contact plug 750, respectively. For example, the width of the field plate plug 700 may be about two to ten times larger than the width of the source contact plug 710 and the drain contact plug 750, respectively. In such an example, the larger the width of the field plate plug, the greater the electric field relaxation effect.

According to the examples, the field plate plug 700 is able to relax the high electric field that is formed in the drain region. That is, the electric field may be uniformly distributed rather than being concentrated on one place. Accordingly, it becomes possible to increase the breakdown voltage of the power semiconductor device 1 by providing the field plate plug 700. In addition, there is no need to use the RESURF structure disposed between the gate electrode 300 and the drain region 410 by using the field plate plug 700. The RESURF structure refers to a thick field oxide layer such as Local Oxidation of Silicon (LOCOS) and/or STI, and is able to omit the process of forming a separate field oxide layer in the first conductivity type drift region 200, which is advantageous with respect to manufacturing process cost. In addition, because the top surface of the substrate between the drain region 410 and the gate electrode 300 becomes flat without the presence of the field oxide layer, a current path in a direction from the drain region 410 toward the source region 430 does not have a curved shape, but instead has a straight shape. In this example, there is an effect that the on-resistance Ron also becomes small with respect to the on state of the power semiconductor device 1.

According to the examples, the field plate plug 700 and the first conductivity type source region 430 are electrically connected to each other, such that it is possible to remove the parasitic capacitance component otherwise occurring between the field plate plug 700 and the first conductivity type drain region 410. The parasitic capacitance component is removed, such that the current applied to the gate electrode 300 may be minimized.

In addition, according to the examples, because the field plate plug 700 is formed so as to penetrate through the interlayer insulating layer 650, a mask process for forming a separate contact is not required. Accordingly, the process for manufacturing the power semiconductor device 1 may be simplified in this manner.

Figure 3A:
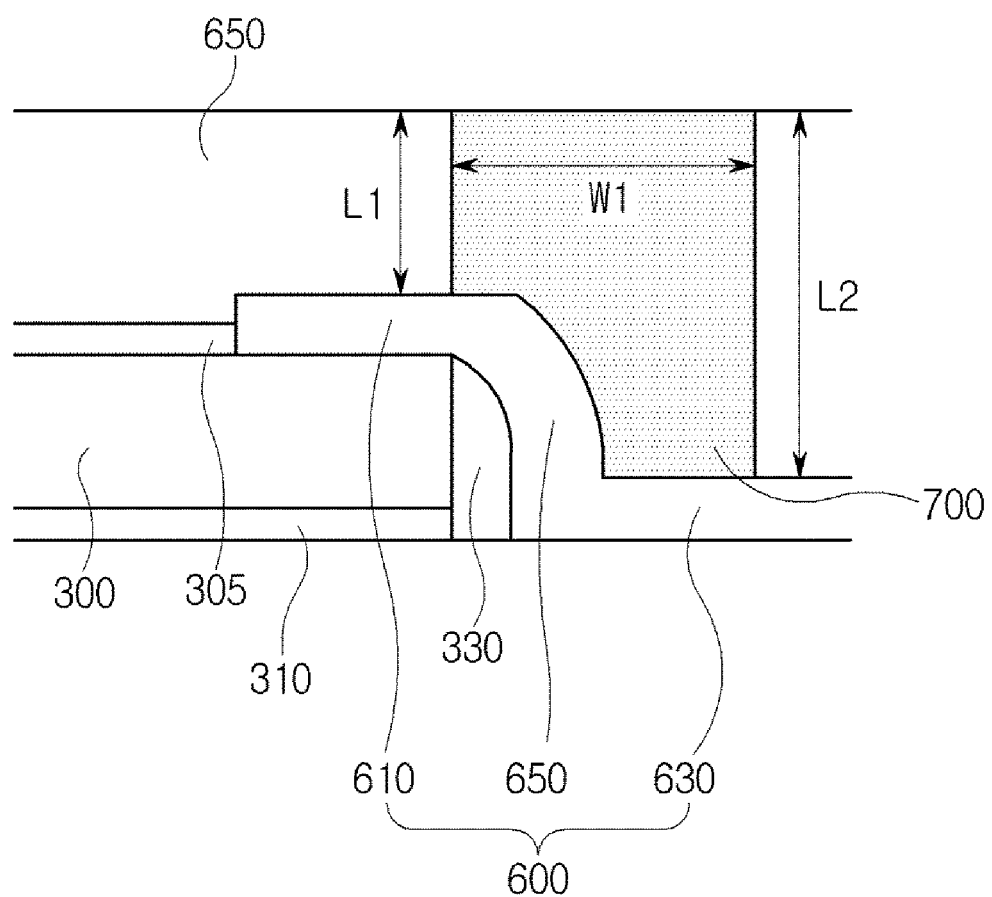
FIGS. 3A and 3B are an enlarged view of region A of the example of FIG. 2.
Figure 3B:
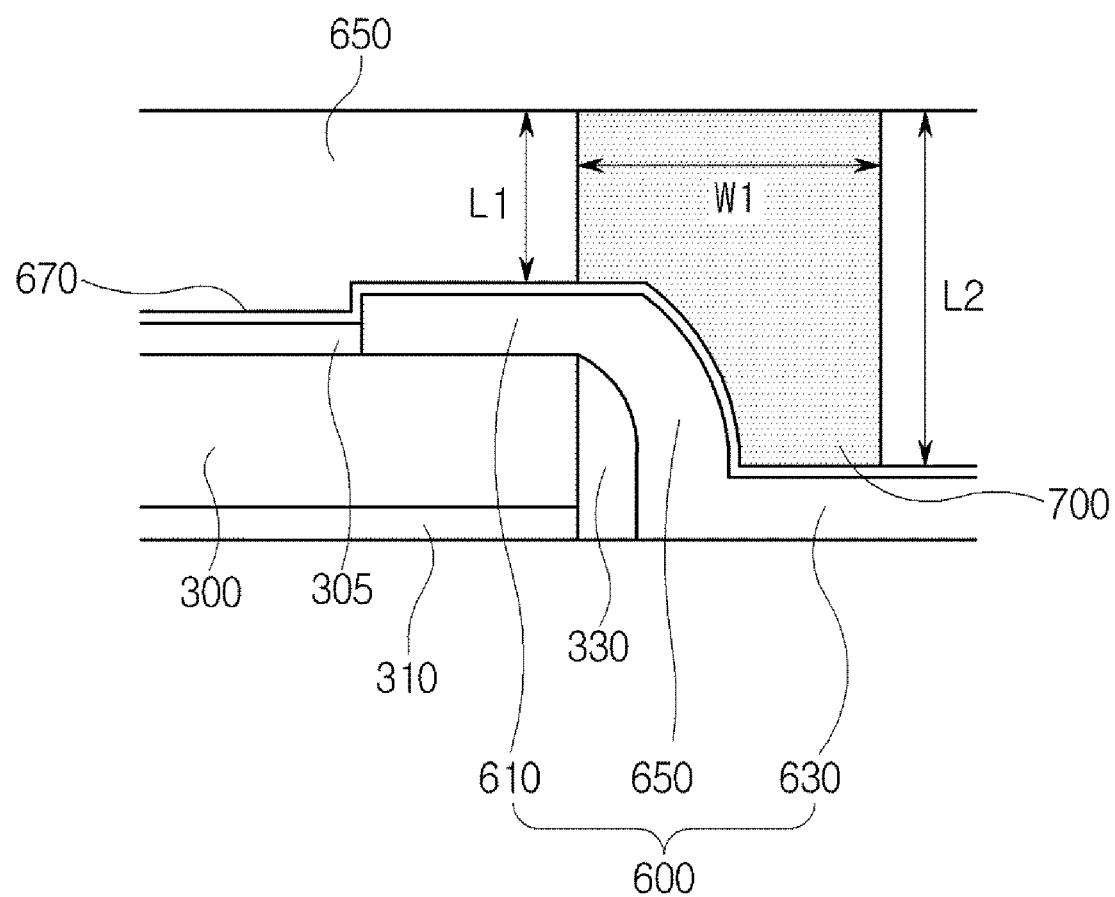

FIGS. 3A and 3B are enlarged views of region A of the example of FIG. 2.

Referring to FIGS. 2, 3A, and 3B, the protection layer 600 serves to insulate the field plate plug 700 from the gate electrode 300, so that the field plate plug 700 and the gate electrode 300 are not electrically connected to each other. As shown in FIGS. 2, 3A, and 3B, the protection layer 600 may include a first region 610, a second region 630, and a third region 650. The first region 610 may be a region disposed on the gate electrode 300, the second region 630 may be a region disposed on the first conductivity type drift region 200, and the third region 650 may be a region connecting the first region 610 to the second region 630. In an example, a top surface of the first region 610 may have a higher level than the top surface of the gate electrode 300 and the top surface of the silicide layer 305. A top surface of the second region 630 may have a higher level than a bottom surface of the gate electrode 300.

Furthermore, the field plate plug 700 may contact the protection layer 600 so as to penetrate through the interlayer insulating layer 650. The field plate plug 700 may be provided on the second region 630 and the third region 650 of the protection layer 600. That is, the field plate plug 700 vertically overlaps with the second region 630 and the third region 650 of the protection layer 600, but may not vertically overlap the first region 610 of the protection layer 600. The field plate plug 700 may be provided so as not to vertically overlap with the gate electrode 300. The field plate plug 700 may have a first length L1 on the first region 610, and may have a second length L2 on the second region 630. In addition, the field plate plug 700 may have a first width W1. In such an example, the second length L2 may be a value greater than the first length L1. In a particular example, a value of the first width W1 may be greater than that of the first length L1. However, a size relationship between the value of the first width W1 and the value of the first length L1 may not be particularly limited, and the values of the first width W1 and the first length L1 may have different relationships. The first width W1 of the field plate plug 700 may be greater than an interval between the top surface of the first region 610 and the top surface of the interlayer insulating layer 650.

In the example of FIG. 3A, a bottom surface of the field plate plug 700 is not flat, but has different steps. This structure is present because the field plate plug 700 is formed on the protection layer 600 having a step. In such an example, the spacer 330 and the protection layer 600 are in direct contact with each other. On the other hand, the top surface of the field plate plug 700 may have a coplanar surface, such that the top surface of the field plate plug 700 is not stepped. That is, the bottom surface of the field plate plug 700 may have a step, and the top surface may be flat. A depth of the bottom surface of the field plate plug 700 is preferably deeper toward the drain region 410. Therefore, the depth of the bottom surface of the field plate plug 700 is deeper than the vicinity of the gate electrode 300, at the drain region 410. A high electric field is generated in the vicinity of the drain region 410. Therefore, when this structure, as presented in the example of FIG. 3A, is employed, the electric field relaxation effect becomes larger.

In the example of FIG. 3B, an etch stop layer 670 is formed over the protection layer, such that the etch stop layer 670 is disposed between the field plate plug and the protection layer 600. The etch stop layer 670 is formed of various appropriate materials, for example, a silicon nitride layer or a silicon oxynitride layer or a silicon oxide layer. However, these are only examples and the etch stop layer 670 may be formed of other materials in other examples. The etch rate of the etch stop layer 670 is lower than that of silicon substrate 110, drift region 200, or interlayer insulating layer 650. Until the formation of contact hole 705, which is illustrated further in the example of FIG. 4E, the etch stop layer 670 remains. As a result, the etch stop layer 670 plays a role of a stopping layer during an etching of the interlayer insulating layer 650 for formation of contact holes 705. Furthermore, the etch stop layer 670 is also formed over the silicide layer 305, such that the etch stop layer 670 is disposed between the interlayer insulating layer 650 and silicide layer 305. Thus, the etch stop layer 670 is a continuous layer formed over the silicon substrate, gate electrode, protection layer, silicide layer, and spacers.

FIGS. 4A to 4F are views illustrating a method for manufacturing a power semiconductor device according to an example.

Figure 4A:
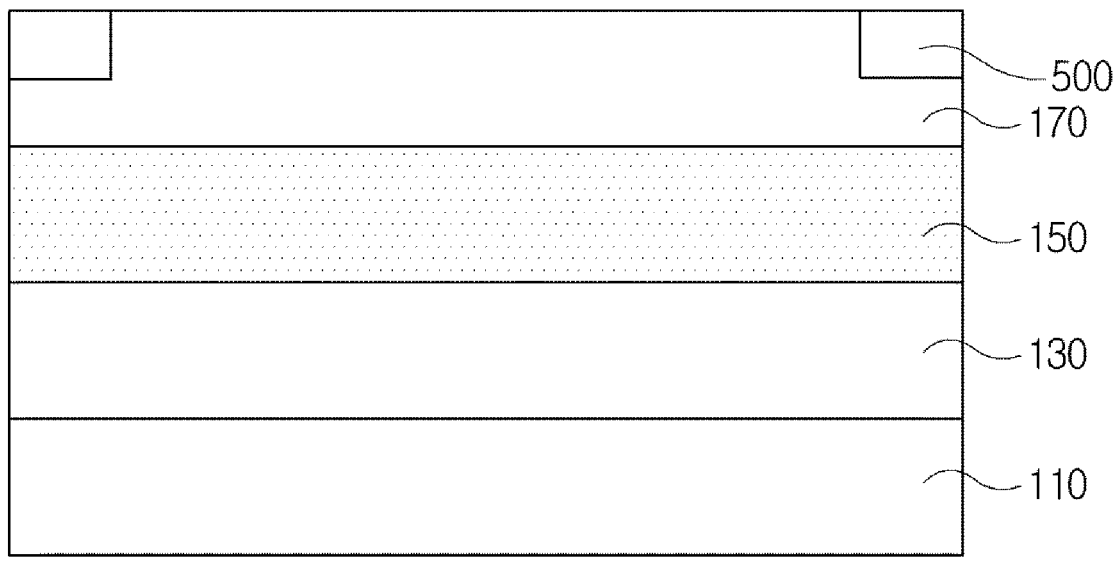
FIGS. 4A to 4F are views illustrating a method for manufacturing a power semiconductor device according to an example.

Referring to the example of FIG. 4A, the first conductivity type buried layer 130 and the second conductivity type buried layer 150 may be sequentially formed on the substrate 110. The first conductivity type buried layer 130 may be formed by implanting N-type impurities, and the second conductivity type buried layer 150 may be formed by implanting P-type impurities. At this time, during the present process, an active region 170 in which a first conductivity type drift region, to be described later, that is provided above the second conductivity type buried layer 150, may be doped with the second conductivity type impurity. For example, the device isolation layer 500 may be formed in the active region 170.

Figure 4B:
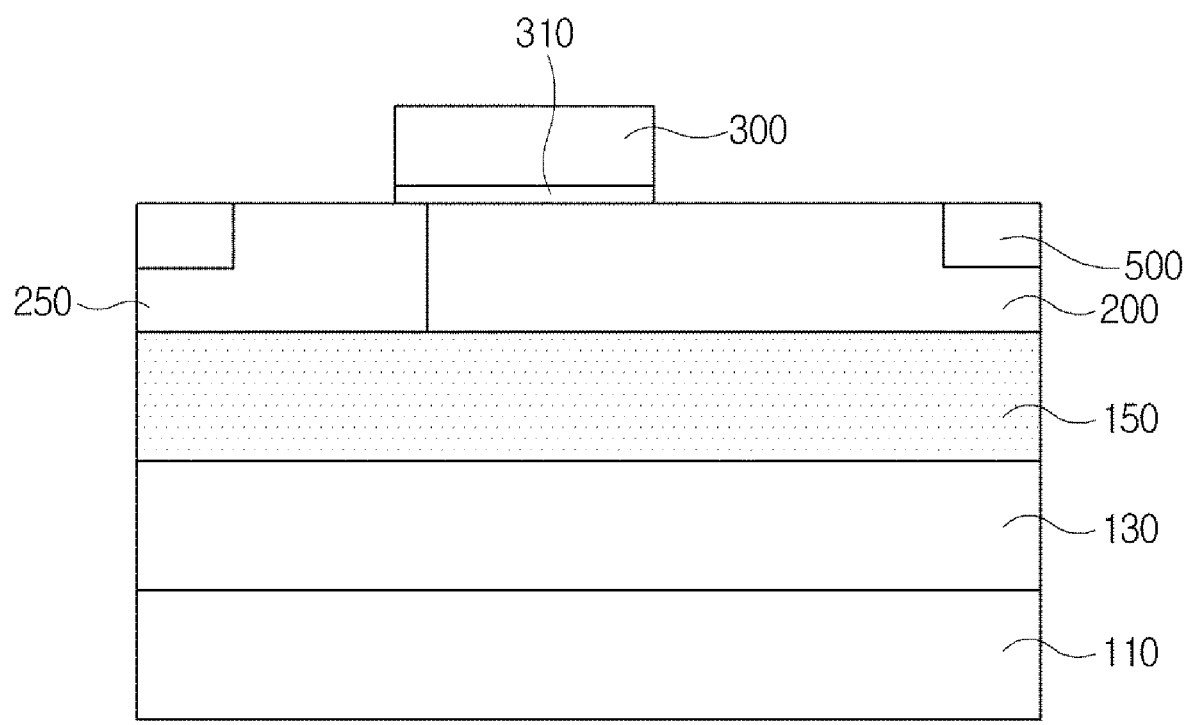

Referring to the example of FIG. 4B, the first conductivity type drift region 200 may be formed on the second conductivity type buried layer 150. The first conductivity type drift region 200 may be formed by implanting N-type impurities, for example.

Thereafter, the gate insulating layer 310 may be formed on the first conductivity type drift region 200, and the gate electrode 300 may be formed on the gate insulating layer 310, as well.

Thereafter, a mask pattern is formed on the gate electrode 300, and the second conductivity type body region 250 may be formed by implanting P-type impurities into the active region 200 using the mask pattern. The second conductivity type body region 250 may be doped with a low-concentration P-type impurity. If the second conductivity type body region 250 is formed, the mask pattern can be removed thereafter.

Figure 4C:
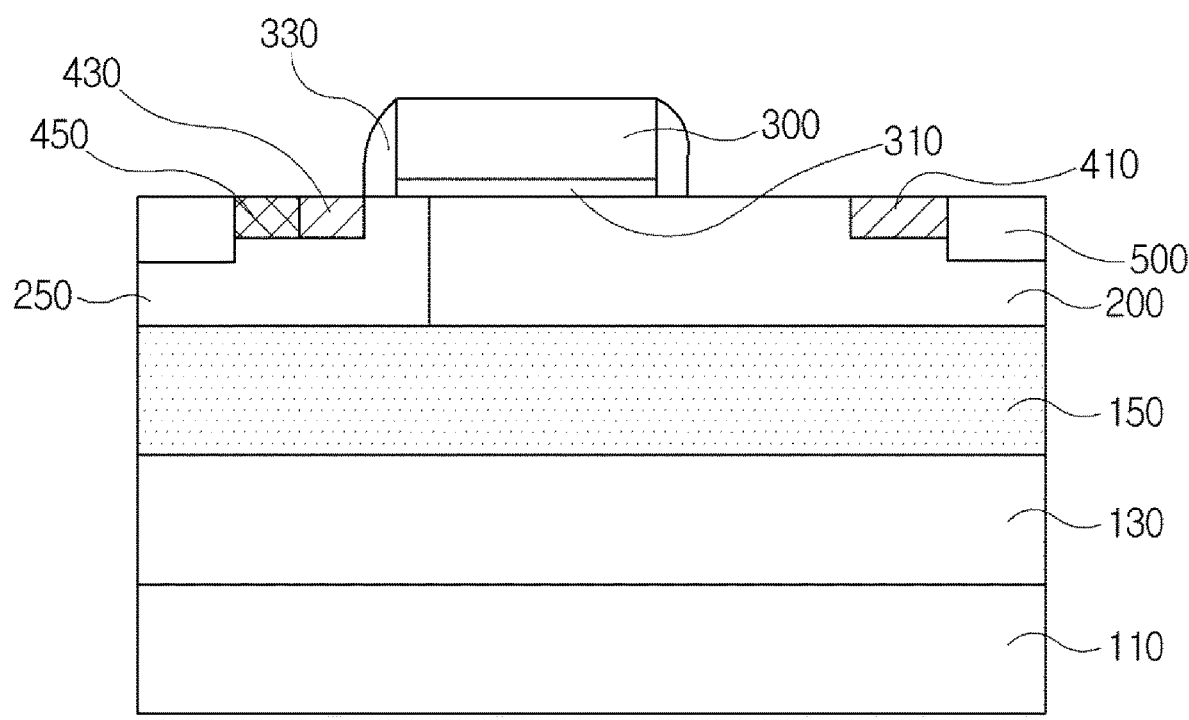

Referring to the example of FIG. 4C, a spacer 330 may be formed to cover a side surface of the gate electrode 300. The first conductivity type drain region 410 may be subsequently formed in the first conductivity type drift region 200, and the first conductivity type source region 430, and a second conductivity type pickup region 450 may be formed in the second conductivity type body region 250. In such an example, the first conductivity type drain region 410 and the first conductivity type source region 430 may be formed by implanting N-type impurities, and the second conductivity type pickup region 450 may be formed by implanting P-type impurities. Furthermore, the second conductivity type pickup region 450 may be doped with a higher concentration of P-type impurities than the second conductivity type body region 250.

Figure 4D:
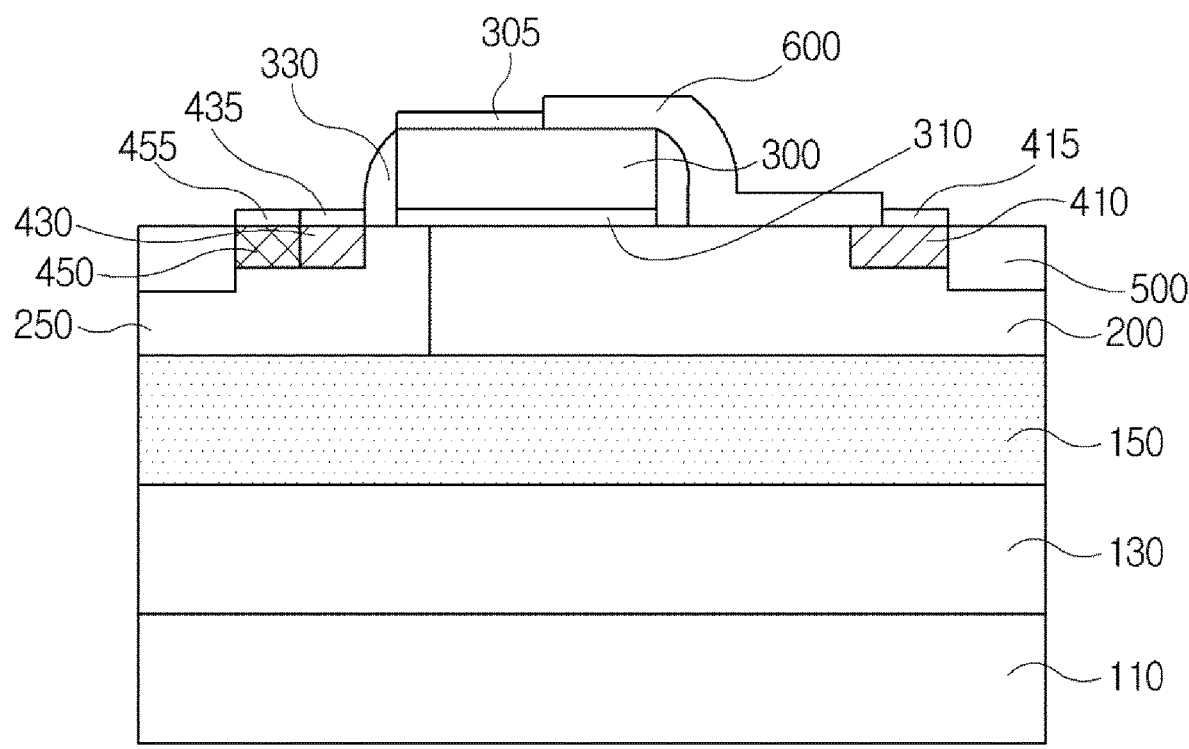

Referring to the example of FIG. 4D, the protection layer 600 may be formed on the first conductivity type drift region 200 and the gate electrode 300. In such an example, the protection layer 600 may be formed to extend from the first conductivity type drift region 200 onto the gate electrode 300. For example, the protection layer 600 may be formed to have a predetermined thickness. That is, a thickness of a portion of the protection layer 600 formed on the gate electrode 300 may be the same as a thickness of a portion of the protection layer 600 formed on the first conductivity type drift region 200. In such an example, the protection layer 600 is a blocking insulating layer for preventing a silicide layer from being formed. When the protection layer 600 is formed on the gate electrode 300 or the top surface of the substrate, a silicide layer is not formed, due to the presence of the protection layer.

Thereafter, the silicide layer 305 may be formed on the exposed top surface of the gate electrode 300, without being covered by the protection layer 600. Additionally, the silicide layer 415 may be formed on the first conductivity type drain region 410, the silicide layer 435 may be formed on the first conductivity type source region 430, and the silicide layer 455 may be formed on the second conductivity type pickup region 450.

Subsequently, an etch stop layer 670, also shown in the example of FIG. 3B, may be formed on the top surface of the protection layer 600, the silicide layer, and the surface of the substrate. The etch stop layer 670, also shown in the example of FIG. 3B, may adjust a length of the interlayer insulating layer that is to be etched in the dry etch process, to be described in greater detail later.

Figure 4E:
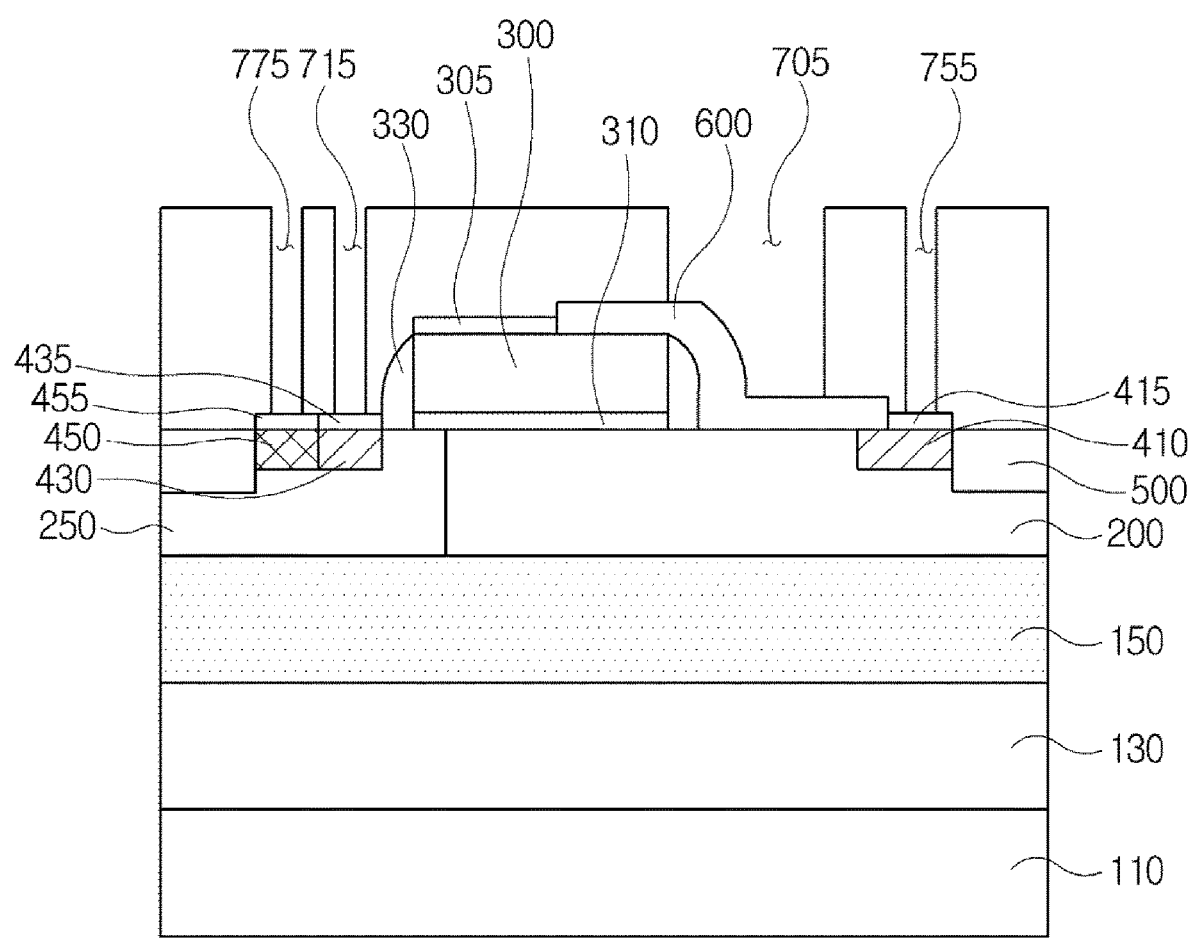

Referring to the example of FIG. 4E, the interlayer insulating layer 650 may be formed to cover the first conductivity type drift region 200, the second conductivity type body region 250, the gate electrode 300, and the protection layer 600.

Thereafter, subsequent to the formation of the interlayer insulating layer 650, contact holes 705, 715, 755, and 775 may be formed to penetrate through the interlayer insulating layer 650. For example, the plurality of contact holes 705, 715, 755, and 775 may be formed by the dry etch process. The plurality of contact holes 705, 715, 755, and 775 may include a source contact hole 715 that exposes the silicide layer 435 on the first conductivity type source region 430, a gate contact hole 670 that exposes the top surface of the gate electrode 300, a drain contact hole 755 that exposes the silicide layer 435 on the first conductivity type drain region 410, a field plate contact hole 705 that exposes the top surface of the protection layer 600, and a body contact hole 775 that exposes the silicide layer 455 on the second conductivity type pickup region 450. At this time, because the etch stop layer 670 is formed on the top surface of the protection layer 600, the field plate contact hole 705 capable of exposing the top surface of the protection layer 600 may be formed without etching the protection layer 600 as well.

A width of the field plate contact hole 705 may be greater than that of the source contact hole 715, the gate contact hole, the body contact hole 775, or the drain contact hole 755, respectively.

Figure 4F:
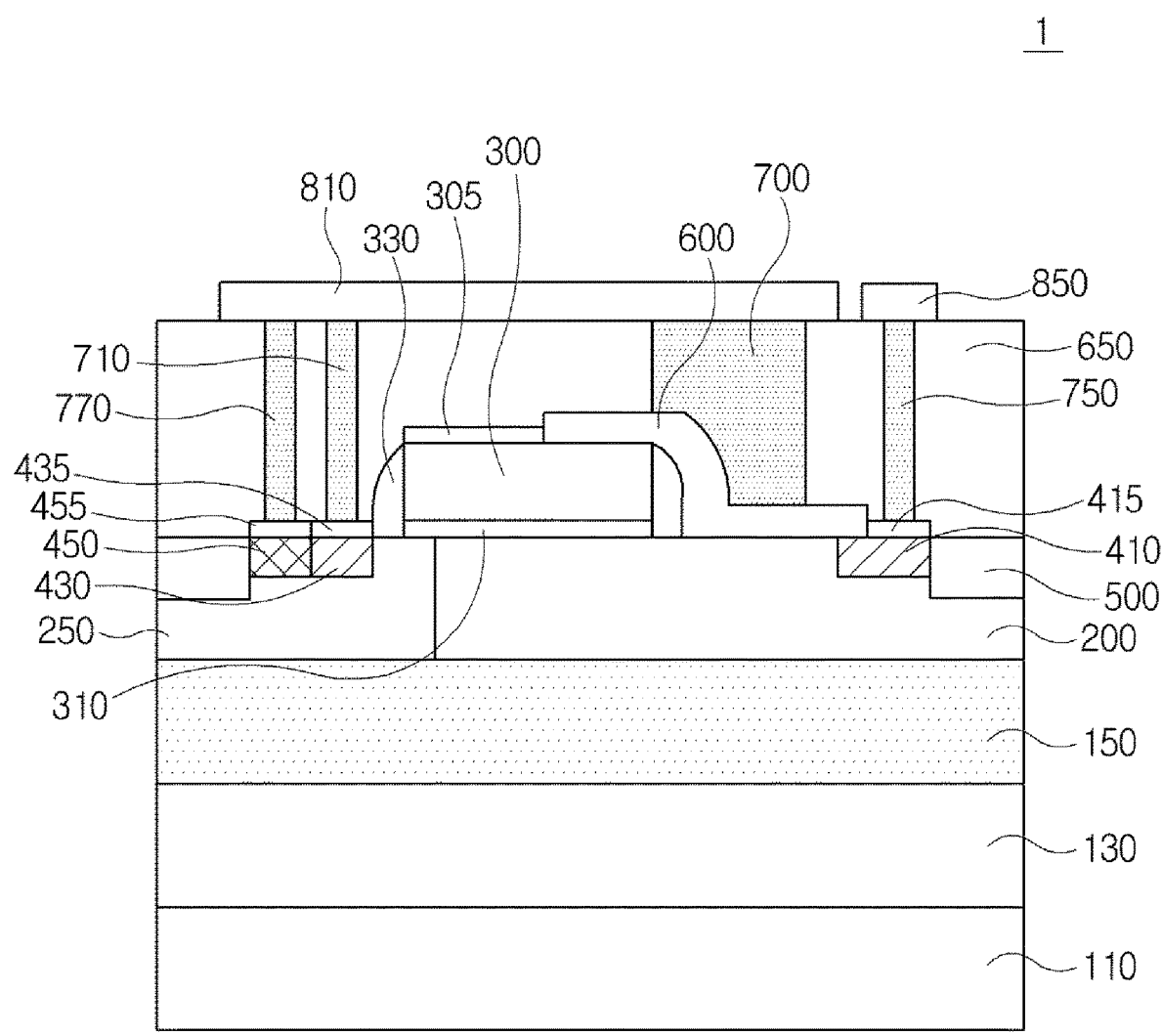

Referring to the example of FIG. 4F, the source contact plug 710, the gate contact plug 730, as shown in the example of FIG. 2, the drain contact plug 750, the field plate plug 700, and the body contact plug 770 may be formed by filling the contact holes 705, 715, 755, and 775 with appropriate conductive materials.

Thereafter, a first conductive line 810 connecting between the source contact plug 710, the body contact plug 770, and the field plate plug 700 may be formed, and a third conductive line 850 connected to the drain contact plug 750 may also be formed. Additionally, a second conductive line 830, as shown in the example of FIG. 1, connected to the gate contact plug 730, as shown in the example of FIG. 1, may be formed. Therefore, the first conductivity type source region 430 and the second conductivity type pickup region 450 may be electrically connected to the first conductive line 810 in order to receive a voltage applied to the first conductive line 810. Also, the first conductivity type drain region 410 may be electrically connected to the third conductive line 850 in order to receive a voltage applied to the third conductive line 850. Also, the gate electrode 300 may be electrically connected to the second conductive line 830, as shown in the example of FIG. 1, to receive a voltage applied to the second conductive line 830, as shown in the example of FIG. 1. Additionally, the field plate plug 700 is also applied with a ground voltage, through the first conductive line 810.

Figure 5:
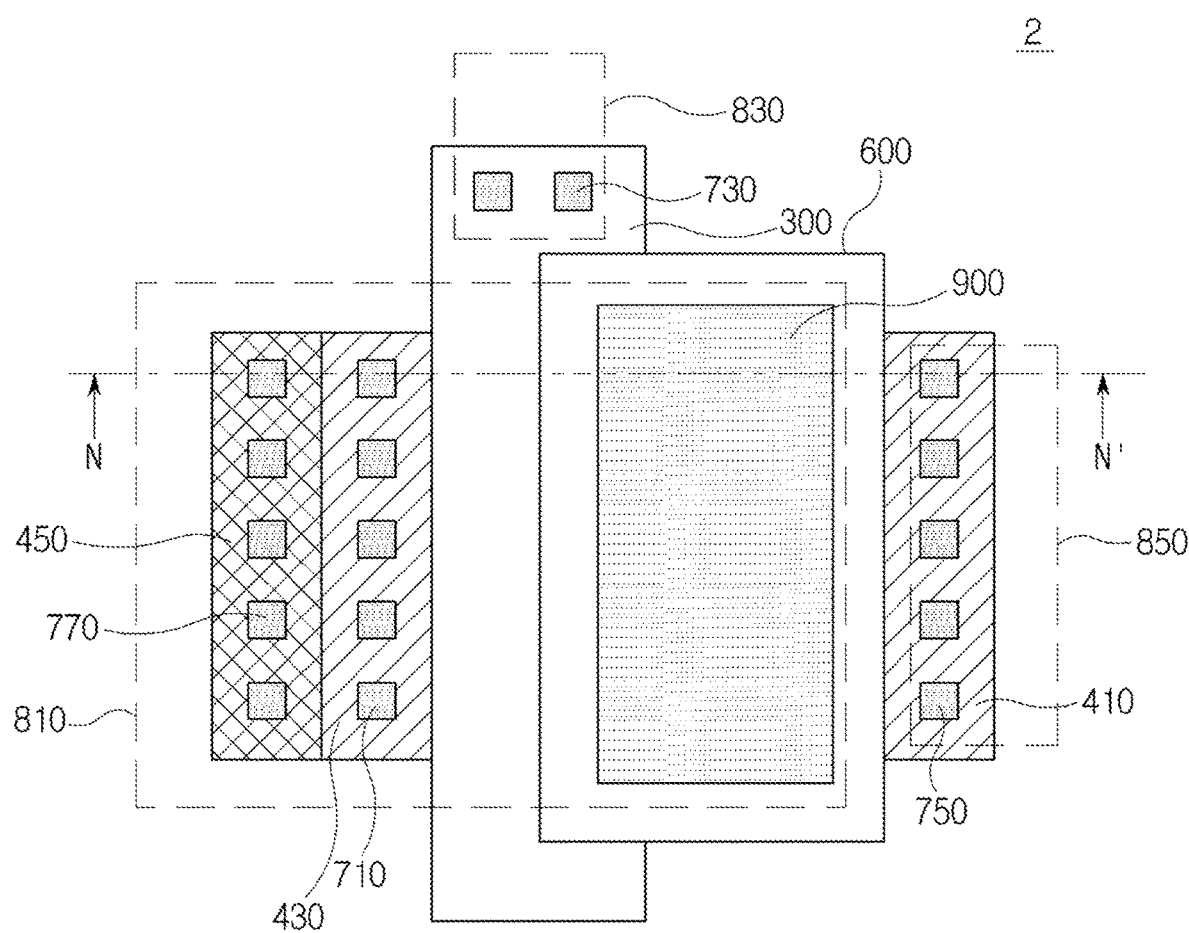
FIG. 5 is a plan view illustrating a power semiconductor device according to another example.
Figure 6:
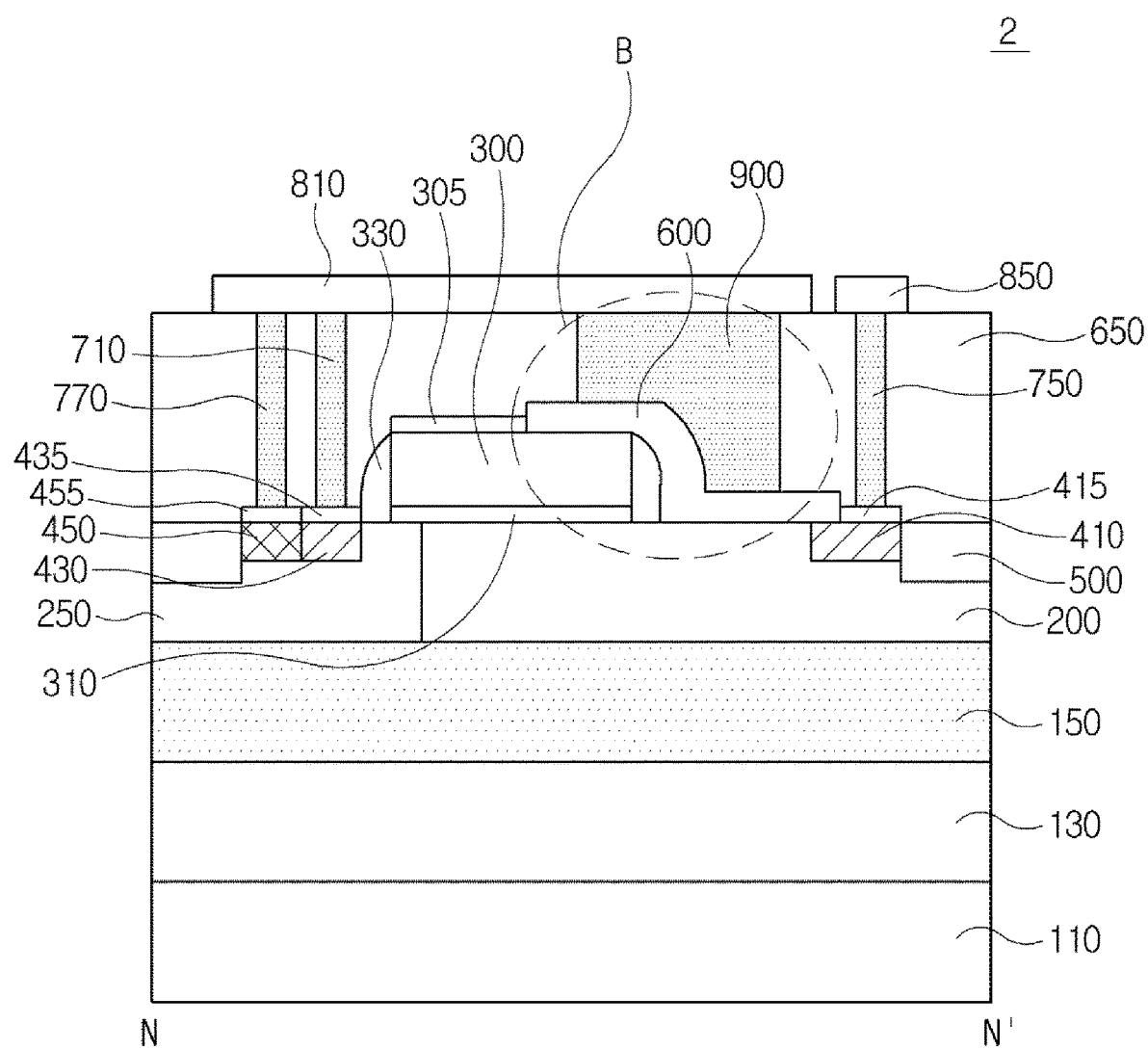
FIG. 6 is a cross-sectional view taken along line N-N' of the example of FIG. 5.
Figure 7A:
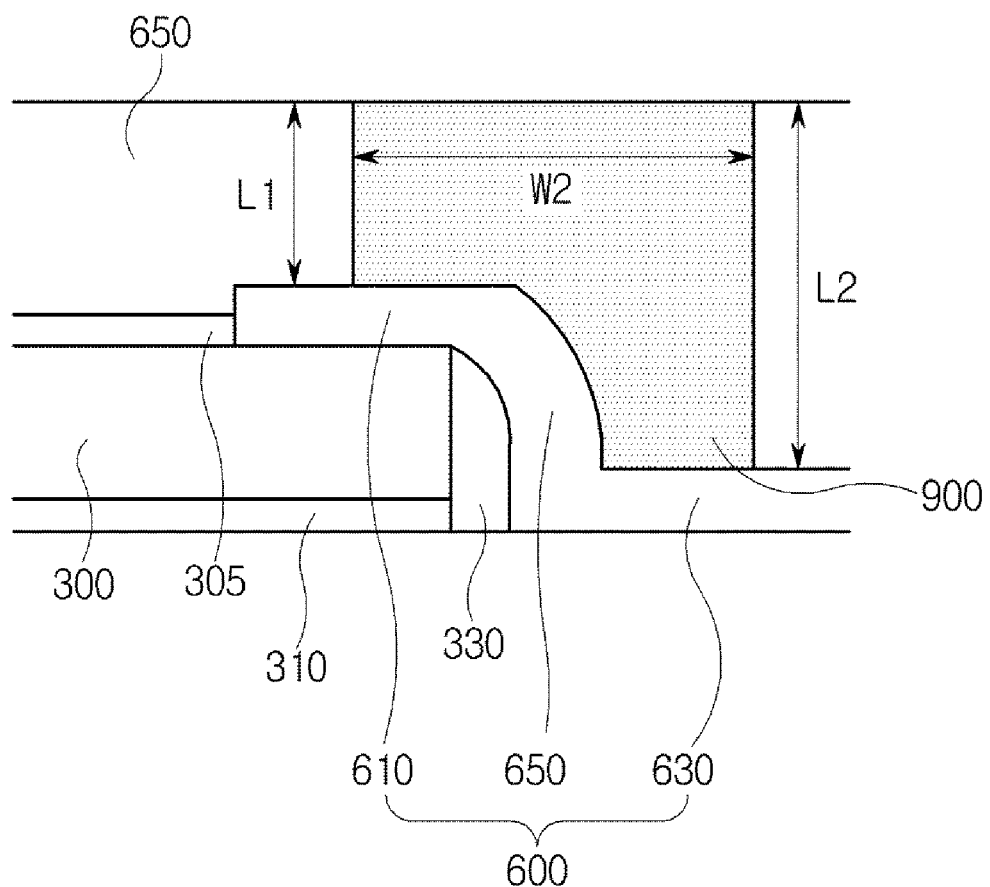
FIG. 7A and FIG. 7B are an enlarged view of region B of the example of FIG. 6.
Figure 7B:
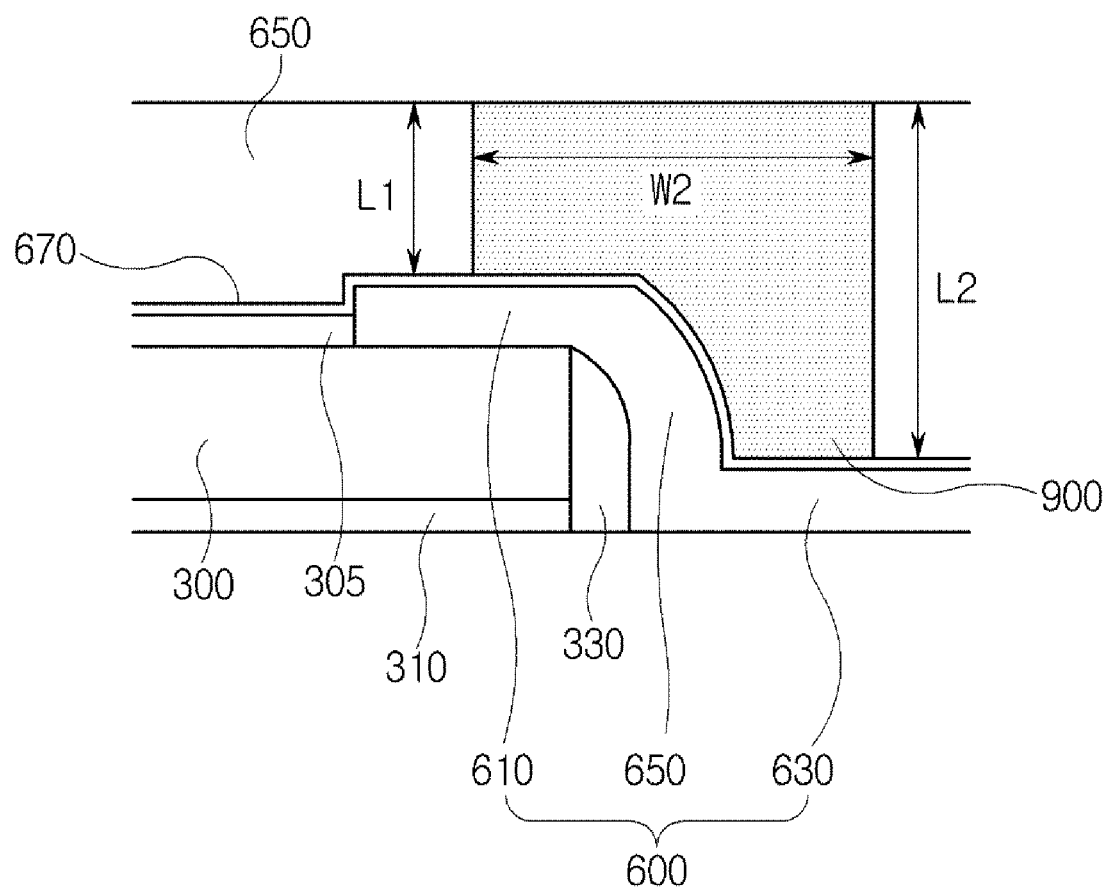

FIG. 5 is a plan view illustrating a power semiconductor device according to another example, FIG. 6 is a cross-sectional view taken along line N-N' of the example of FIG. 5, and FIGS. 7A and 7B are enlarged views of a region B of FIG. 6. A description of overlapping contents with FIG. 3A is omitted for simplicity of explanation.

Referring to the examples of FIGS. 5, 6, 7A and 7B, the protection layer 600 may include a first region 610, a second region 630, and a third region 650. The first region 610 may be a region disposed on the gate electrode 300, the second region 630 may be a region disposed on the first conductivity type drift region 200, and the third region 650 may be a region connecting the first region 610 to the second region 630.

For example, a field plate plug 900 may contact the protection layer 600 so as to penetrate through the interlayer insulating layer 650. The field plate plug 900 may be provided on the first region 610, the second region 630 and the third region 650 of the protection layer 600. That is, the field plate plug 900 may vertically overlap with the first region 610 of the protection layer 600, unlike the example illustrated in the example of FIG. 3A. When viewed as a plane, an area of the field plate plug 900 may be smaller than that of the protection layer 600. In addition, portion of the field plate plug 900 may be provided so as to vertically overlap with the gate electrode 300. Additionally, the field plate plug 900 may have a first length L1 on the first region 610, and may have a second length L2 on the second region 630. In such an example, the first length L1 and the second length L2 each refer to a depth from the top surface of the field plate plug toward the substrate. Also, the second length L2 is greater than the first length L1. That is, a depth of a bottom surface of the field plate plug 700 is preferably deeper toward the drain region 410. Therefore, the depth of the bottom surface of the field plate plug 700 is deeper than the vicinity of the gate electrode 300, at the drain region 410. A high electric field is generated in the vicinity of the drain region 410. Therefore, when this structure is employed, the electric field relaxation effect becomes larger.

In addition, the field plate plug 900 may have a second width W2. At this time, a value of the second width W2 may be greater than that of the first length L1. That is, the second width W2 of the field plate plug 900 may be greater than an interval L1 between the top surface of the first region 610 and the top surface of the interlayer insulating layer 650. The larger the width in such an example, the greater the area of the field plate plug, and, accordingly, the greater the electric field relaxation effect.

In the example of FIG. 7A, a bottom surface of the field plate plug 700 is not flat, but has different steps. This is structure is because the field plate plug 700 is formed on the protection layer 600, the protection layer 600 having a stepped structure. In such a spacer 330 and the protection layer 600 are in direct contact with each other. On the other hand, the top surface of the field plate plug 700 may have a coplanar or level surface.

In the example of FIG. 7B, an etch stop layer 670 is formed over the protection layer, such that the etch stop layer 670 is disposed between the field plate plug and the protection layer 600. The etch stop layer 670 is formed of materials that block etching appropriately, such as, silicon nitride layer or silicon oxynitride layer or silicon oxide layer. However, other etch stop materials may be used in other examples to form the etch stop layer 670. The etch rate of the etch stop layer 670 is lower than that of silicon substrate 110, drift region 200, or interlayer insulating layer 650. Until the formation of contact hole 705, as shown in FIG. 4E, the etch stop layer 670 remains. Thus, the etch stop layer 670 plays a role of a stopping layer during an etching of the interlayer insulating layer 650 for the formation of contact holes 705. Furthermore, the etch stop layer 670 is also formed over the silicide layer 305, such that the etch stop layer 670 is disposed between the interlayer insulating layer 650 and silicide layer 305. Accordingly, the etch stop layer 670 is formed to be a continuous layer formed over silicon substrate, gate electrode, protection layer, silicide layer, and spacers.

According to the examples, it is possible to relax the high electric field otherwise applied to the drain region through the field plate plug. Thus, it is possible to increase the breakdown voltage of the power semiconductor device by providing the field plate plug, as provided in examples.

According to the examples, it is possible to reduce the on resistance Ron between the source region and the drain region, because the field relaxation oxide layer formed under the gate electrode is not required to be formed.

According to the examples, the second conductivity type buried layer under the first conductivity type drift region is used to extend the area of the depletion layer in the reverse bias state, thereby increasing the breakdown voltage of the power semiconductor device accordingly.

According to the examples, the field plate plug and the first conductivity type source region may be electrically connected to each other, thereby removing the parasitic capacitance component generated between the field plate plug and the first conductivity type drain region.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device, comprising:
   a drain region and a source region disposed on a substrate;
   a gate insulating layer and a gate electrode disposed on the substrate and disposed between the drain region and the source region;
   a protection layer in contact with a top surface of the substrate and a top surface of the gate electrode;
   a source contact plug connected to the source region;
   a drain contact plug connected to the drain region; and
   a field plate plug in contact with the protection layer,
   wherein a width of the field plate plug is greater than a width of the source contact plug or a width of the drain contact plug,
   wherein a bottom surface of the field plug has a non-planar surface, and a top surface of the field plate plug is flat.

2. The power semiconductor device of claim 1, wherein a portion of the field plate plug vertically overlaps with the gate electrode.

3. The power semiconductor device of claim 1, wherein the protection layer comprises:
   a first region disposed on the gate electrode;
   a second region disposed on the substrate; and
   a third region connecting the first region with the second region, wherein
   the field plate plug vertically overlaps with the second region.

4. The power semiconductor device of claim 3, wherein the field plate plug has a first length on the first region, the field plate plug has a second length on the second region, and the second length is greater than the first length.

5. The power semiconductor device of claim 4, wherein the width of the field plate plug is greater than the first length.

6. The power semiconductor device of claim 1, further comprising:
   an interlayer insulating layer disposed on the gate electrode and the protection layer,
   wherein the field plate plug penetrates through the interlayer insulating layer.

7. The power semiconductor device of claim 1, further comprising:
   a conductive line connecting the source contact plug to the field plate plug, wherein the field plate plug is in direct contact with the conductive line.

8. The power semiconductor device of claim 1, further comprising:
   a first conductivity type buried layer disposed on the substrate; and
   a second conductivity type buried layer disposed on the first conductivity type buried layer.

9. The power semiconductor device of claim 1, further comprising:
   a first conductivity type drift region and a second conductivity type body region disposed on the substrate.

10. The power semiconductor device of claim 9, wherein the gate insulating layer is disposed between the gate electrode and the first conductivity type drift region, and the gate insulating layer is disposed between the gate electrode and the second conductivity type body region.

11. The power semiconductor device of claim 9, wherein the drain region is a first conductivity type drain region and is disposed in the first conductivity type drift region.

12. The power semiconductor device of claim 1, further comprising a silicide layer disposed on a top surface of the drain region.

13. The power semiconductor device of claim 1, wherein when viewed as a plane, the field plate plug is provided as having a single plate shape provided on the protection layer.

14. The power semiconductor device of claim 1, wherein a portion of the protection layer is in contact with the drain region.

15. The power semiconductor device of claim 1, further comprising an etch stop layer disposed between a bottom surface of the field plate plug and a top surface of the protection layer.

16. The power semiconductor device of claim 1, further comprising:
   spacers provided at sidewalls of the gate electrode,
   wherein the field plate plug vertically overlaps with the spacers.

17. A method for manufacturing a power semiconductor device, comprising:
   providing a substrate;
   forming a gate insulating layer and a gate electrode on the substrate;
   forming a drain region and a source region on the substrate;
   forming a protection layer on the gate electrode;
   forming an interlayer insulating layer disposed on the gate electrode and the protection layer;
   forming a source contact hole, a drain contact hole, and a field plate hole, which expose the source region, the drain region, and the protection layer, respectively, by etching the interlayer insulating layer; and
   forming a source contact plug connected to the source region, a drain contact plug connected to the drain region, and a field plate plug contacting the protection layer, respectively, by filling the source contact hole, the drain contact hole, and the field plate hole, respectively with a conductive material,
   wherein a width of the field plate plug is greater than a width of the source contact plug or a width of the drain contact plug,
   wherein a bottom surface of the field plug has a non-planar surface, and a top surface of the field plate plug is flat.

18. The method of claim 17, wherein the providing of the substrate comprises:
   forming a first conductivity type buried layer on the substrate;
   forming a second conductivity type buried layer on the first conductivity type buried layer; and
   forming a first conductivity type drift region and a second conductivity type body region on the second conductivity type buried layer.

19. The method of claim 17, further comprising:
   forming a conductive line connecting the source contact plug to the field plate plug.

20. The method of claim 17, further comprising:
   forming a silicide layer on each of a top surface of the gate electrode, a top surface of the source region, and a top surface of the drain region.

* * * * *

UNITED STATES PATENT AND TRADEMARK OFFICE
CERTIFICATE OF CORRECTION

PATENT NO. : 10,566,422 B2
APPLICATION NO. : 16/054472
DATED : February 18, 2020
INVENTOR(S) : Tae Hoon Lee, Jun Hee Cho and Jin Seong Chung It is certified that error appears in the above-identified patent and that said Letters Patent is hereby corrected as shown below:

In the Claims

In Claim 1, Column 15:
Line 15, should read --- wherein a bottom surface of the field plate plug has a non-planar surface, and a top surface of the field plate plug is flat ---

In Claim 17, Column 16:
Line 44, should read --- wherein a bottom surface of the field plate plug has a non-planar surface, and a top surface of the field plate plug is flat ---

Signed and Sealed this
Fourteenth Day of May, 2024

Katherine Kelly Vidal
*Director of the United States Patent and Trademark Office*